(12) United States Patent
Kang et al.

(10) Patent No.: US 9,418,747 B2
(45) Date of Patent: Aug. 16, 2016

(54) NONVOLATILE MEMORY DEVICE MAINTAINING A BITLINE PRECHARGE DURING PROGRAM VERIFICATION PERIODS FOR MULTI-LEVEL MEMORY CELLS AND RELATED PROGRAMMING METHOD

(71) Applicant: SAMSUNG ELECTRONICS CO., LTD., Suwon-Si, Gyeonggi-Do (KR)

(72) Inventors: Dong-Ku Kang, Seongnam-Si (KR); Seung-Bum Kim, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 153 days.

(21) Appl. No.: 14/227,314

(22) Filed: Mar. 27, 2014

(65) Prior Publication Data

US 2015/0023108 A1 Jan. 22, 2015

(30) Foreign Application Priority Data

Jul. 19, 2013 (KR) ........................ 10-2013-0085341

(51) Int. Cl.

| | |
|---|---|
| *G11C 16/34* | (2006.01) |
| *G11C 16/26* | (2006.01) |
| *G11C 11/56* | (2006.01) |
| *G11C 16/04* | (2006.01) |
| *G11C 16/06* | (2006.01) |

(52) U.S. Cl.
CPC ............ *G11C 16/26* (2013.01); *G11C 11/5642* (2013.01); *G11C 16/0483* (2013.01); *G11C 16/06* (2013.01); *G11C 16/3459* (2013.01)

(58) Field of Classification Search
CPC ............... G11C 16/0483; G11C 16/26; G11C 16/3459; G11C 16/3463; G11C 16/12; G11C 16/24

See application file for complete search history.

(56) References Cited

U.S. PATENT DOCUMENTS

| | | | |
|---|---|---|---|
| 6,240,020 B1 | 5/2001 | Yang et al. | |
| 7,145,806 B2 | 12/2006 | Kawai | |
| 7,254,064 B2 | 8/2007 | Kim et al. | |
| 7,564,711 B2 * | 7/2009 | Mokhlesi | G11C 5/147 365/185.03 |
| 7,701,776 B2 | 4/2010 | Gallo et al. | |
| 8,009,470 B2 | 8/2011 | Iwai et al. | |
| 8,169,830 B2 | 5/2012 | Moschiano et al. | |
| 8,830,760 B2 * | 9/2014 | Funatsuki | G11C 16/3459 365/185.21 |
| 2010/0182841 A1 | 7/2010 | Lee | |
| 2010/0182844 A1 | 7/2010 | Han | |
| 2010/0329028 A1 | 12/2010 | Lim et al. | |
| 2010/0329031 A1 | 12/2010 | Lee | |
| 2011/0013467 A1 | 1/2011 | Moore | |
| 2011/0216602 A1 | 9/2011 | Kim et al. | |

* cited by examiner

*Primary Examiner* — Andrew Q Tran
(74) *Attorney, Agent, or Firm* — Volentine & Whitt, PLLC

(57) ABSTRACT

A nonvolatile memory device comprises a memory cell array comprising multiple memory cells disposed at intersections of corresponding word lines and bitlines, and multiple page buffers connected to the bitlines, respectively, and performing consecutive verify read operations on selected memory cells programmed in first to N-th logic states (N>2), wherein, in the consecutive verify read operations, the bitlines are placed in a precharged state by precharging them to a first level during a verification period of memory cells programmed in the first logic state, are maintained in the precharged state during verification periods of memory cells programmed in the second to (N−1)-th logic states, and are discharged after a verification period of memory cells programmed in the N-th logic state.

20 Claims, 14 Drawing Sheets

NONVOLATILE MEMORY DEVICE MAINTAINING A BITLINE PRECHARGE DURING PROGRAM VERIFICATION PERIODS FOR MULTI-LEVEL MEMORY CELLS AND RELATED PROGRAMMING METHOD

CROSS-REFERENCE TO RELATED APPLICATION

This application claims priority under 35 U.S.C. 119 to Korean Patent Application No. 10-2013-0085341 filed on Jul. 19, 2013, the subject matter of which is hereby incorporated by reference.

BACKGROUND OF THE INVENTION

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include static random access memory (SRAM), dynamic random access memory (DRAM), and synchronous dynamic random access memory (SDRAM). Examples of nonvolatile memory devices include read only memory (ROM), programmable read only memory (PROM), erasable programmable read only memory (EPROM), electrically erasable programmable read only memory (EEPROM), flash memory, phase-change random access memory (PRAM), resistive read only memory (RRAM), magnetoresistive random access memory (MRAM), and ferroelectric random access memory (FRAM).

Among nonvolatile memory devices, flash memory has achieved popularity in recent years due to attractive features such as relatively high storage capacity and performance, as well as low cost. Nevertheless, there is a continuing demand for flash memory devices having even higher storage capacity and performance, as well as lower cost. Accordingly, in an effort to address this demand, researchers are engaged in continual efforts to improve numerous aspects of flash memory.

SUMMARY OF THE INVENTION

In one embodiment of the inventive concept, a nonvolatile memory device comprises a memory cell array comprising multiple memory cells disposed at intersections of corresponding word lines and bitlines, and multiple page buffers connected to the bitlines, respectively, and performing consecutive verify read operations on selected memory cells programmed in first to N-th logic states (N>2), wherein, in the consecutive verify read operations, the bitlines are placed in a precharged state by precharging them to a first level during a verification period of memory cells programmed in the first logic state, are maintained in the precharged state during verification periods of memory cells programmed in the second to (N−1)-th logic states, and are discharged after a verification period of memory cells programmed in the N-th logic state.

In another embodiment of the inventive concept, a method of programming a nonvolatile memory device comprises supplying a program voltage to word lines during a program period to program memory cells to one of multiple logic states, and consecutively supplying verify voltages corresponding to first to N-th states (N>2) to the word lines during a verification period while supplying a precharge voltage to bitlines to consecutively perform verify read operations on memory cells programmed in first to N-th states, wherein the bitlines are placed in a precharged state by precharging them to a first level during a verification period of memory cells programmed to the first logic state, are maintained in the precharged state during verification periods of memory cells programmed in the second to (N−1)-th states, and are discharged after a verification period of memory cells programmed to the N-th state.

In another embodiment of the inventive concept, a system comprises a host device and nonvolatile memory device operating under control of the host device. The nonvolatile memory device comprises a memory cell array comprising multiple memory cells disposed at intersections of corresponding word lines and bitlines, and multiple page buffers connected to the bitlines, respectively, and performing consecutive verify read operations on selected memory cells programmed in first to N-th logic states (N>2), wherein, in the consecutive verify read operations, the bitlines are placed in a precharged state by precharging them to a first level during a verification period of memory cells programmed in the first logic state, are maintained in the precharged state during verification periods of memory cells programmed in the second to (N−1)-th logic states, and are discharged after a verification period of memory cells programmed in the N-th logic state.

These and other embodiments of the inventive concept can potentially improve the reliability of program operations by avoiding an undesired loss of charge on precharged bitlines during read verification periods.

BRIEF DESCRIPTION OF THE DRAWINGS

The drawings illustrate selected embodiments of the inventive concept. In the drawings, like reference numbers indicate like features.

DETAILED DESCRIPTION

Figure 1:
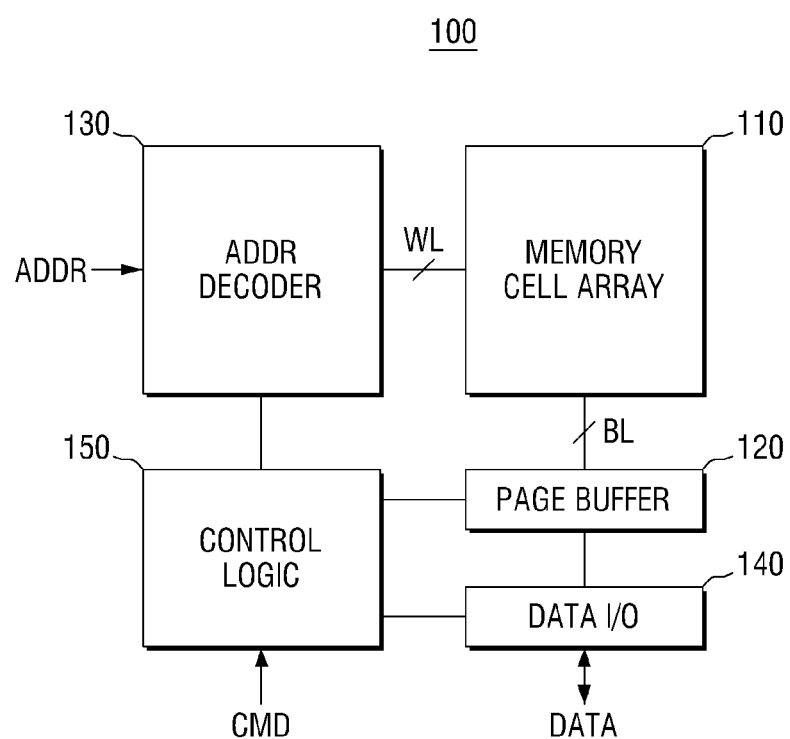
FIG. 1 is a block diagram of a nonvolatile memory device according to an embodiment of the inventive concept.

Embodiments of the inventive concept are described below with reference to the accompanying drawings. These embodiments are presented as teaching examples and should not be construed to limit the scope of the inventive concept.

In the description that follows, where a feature is referred to as being "on" another feature, it can be directly on the other feature, or intervening features may also be present. In contrast, where a feature is referred to as being "directly on" another feature, there are no intervening features present. Spatially relative terms, such as "beneath," "below," "lower," "above," "upper" and the like, may be used herein for ease of description to describe one feature's relationship to another feature as illustrated in the figures. The spatially relative terms are intended to encompass different orientations of the device in use or operation in addition to the orientation depicted in the figures. For example, if a device shown in the figures is turned over, features described as "below" or "beneath" other features would then be oriented "above" the other features. Thus, the example term "below" can encompass both an orientation of above and below. The device may be otherwise oriented (rotated 90 degrees or at other orientations) and the spatially relative descriptors used herein interpreted accordingly.

Terms such as "a" and "an" and "the" and similar referents are to be construed to cover both the singular and the plural, unless otherwise indicated herein or clearly contradicted by context. Terms such as "comprising," "having," "including," and "containing" are to be construed as open-ended terms (i.e., meaning "including, but not limited to") unless otherwise noted.

Unless otherwise indicated, all technical and scientific terms used herein have the same meaning as commonly understood by one of ordinary skill in the art. The use of any and all examples, or example terms provided herein is intended merely to better illuminate the inventive concept and is not a limitation on the scope of the inventive concept unless otherwise specified. Further, unless defined otherwise, terms such as those defined in generally used dictionaries should not be interpreted in an overly formal sense.

The inventive concept will be described with reference to perspective views, cross-sectional views, and/or plan views, in which certain embodiments of the inventive concept are shown. Thus, the profile of an example view may be modified according to manufacturing techniques and/or allowances. That is, the described embodiments are not intended to limit the scope of the inventive concept but cover all changes and modifications that can be caused due to a change in manufacturing process. Thus, regions shown in the drawings are illustrated in schematic form and the shapes of the regions are presented simply by way of illustration and not as a limitation.

Certain embodiments of the inventive concept will be described with regard to a nonvolatile memory device, specifically an NAND flash memory device. However, the inventive concept is not limited to the flash memory device.

FIG. 1 is a block diagram of a nonvolatile memory device 100 according to an embodiment of the inventive concept.

Referring to FIG. 1, nonvolatile memory device 100 comprises a memory cell array 110, a page buffer 120, an address (ADDR) decoder 130, a data input/output (I/O) circuit 140 and a control logic 150.

Memory cell array 110 comprises multiple word lines WL and multiple bitlines BL. Multiple memory cells are formed at intersections of word lines WL and bitlines BL. For example, memory cell array 110 may be configured in a single layer array structure or a multi layer array structure, which is well known in the related art. Memory cell array 110 may be connected to ADDR decoder 130 through word lines WL. Memory cell array 110 may also be connected to page buffer 120 through bitlines BL.

Page buffer 120 stores data to be programmed in memory cell array 110 and/or data read from memory cell array 110. Page buffer 120 may operate as a write driver or a sense amplifier according to the operation of nonvolatile memory device 100. For example, where nonvolatile memory device 100 performs a program operation, page buffer 120 may operate as a write driver, and where nonvolatile memory device 100 performs a read operation, page buffer 120 may operate as a sense amplifier.

Page buffer 120 performs a read operation in response to a control signal from control logic 150. Page buffer 120 supplies a precharge voltage to a sensing node and a bitline BL, and senses a change in the voltage level of the sensing node, thereby determining a threshold voltage of memory cells.

ADDR decoder 130 receives an address ADDR from an external device (e.g., a host or a memory controller) and selects a word line WL of memory cell array 110 corresponding to address ADDR. ADDR decoder 130 receives a voltage for programming memory cells from control logic 150 and may supply the voltage to a selected word line WL and/or an unselected word line WL.

Data I/O circuit 140 exchanges data with page buffer 120 in response to a control signal of control logic 150. For example, when nonvolatile memory device 100 performs a program operation, data I/O circuit 140 provides data received from the external device to page buffer 120. In addition, where nonvolatile memory device 100 performs a read operation, data I/O circuit 140 may provide the data received from page buffer 120 to the external device.

Control logic 150 controls operations of nonvolatile memory device 100. For example, it typically controls page buffer 120, ADDR decoder 130, data I/O circuit 140, and so on, in response to an externally applied command CMD. Control logic 150, which comprises a voltage generator, generates voltages for program, erase and read operations of nonvolatile memory device 100.

Figure 2:
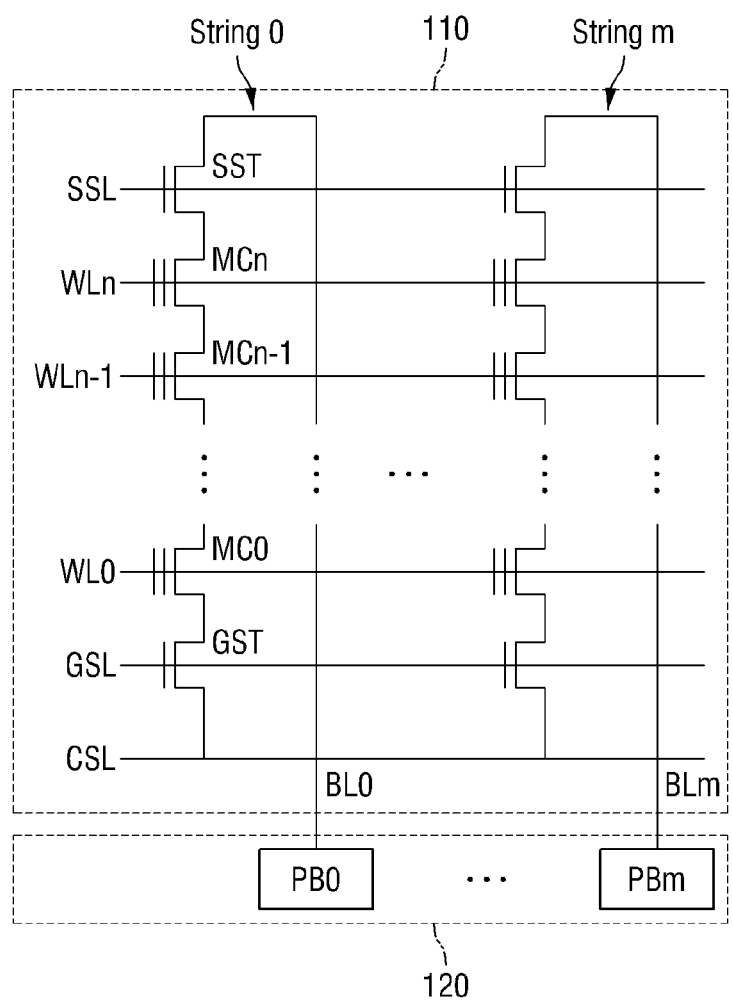
FIG. 2 is a block diagram illustrating a memory cell array and a page buffer shown in FIG. 1, according to an embodiment of the inventive concept.

FIG. 2 is a block diagram illustrating a memory cell array and a page buffer shown in FIG. 1, according to an embodiment of the inventive concept.

Referring to FIG. 2, memory cell array 110 comprises multiple NAND strings (string 0 to string m). NAND strings "string 0" to "string m" may constitute a memory block, and multiple memory blocks may constitute memory cell array 110.

NAND strings string 0 to string m correspond to bitlines BL0 to BLm, respectively. Each of the NAND strings comprises a string select transistor SST, multiple memory cells MC0 to MCn, and a ground select transistor GST. A drain of string select transistor SST is connected to a corresponding bitline BL and a source of ground select transistor GST may be a connected to a common source line CSL. Memory cells MC0 to MCn are connected to each other in series between string select transistors SST and ground select transistors GST.

Memory cells MC0 to MCn arranged on the same row are commonly connected to corresponding word lines WL0 to WLn. String select transistors SST arranged on the same row are commonly connected to a string select line SSL. Ground select transistors GST arranged on the same row are commonly connected to a ground select line GSL.

Memory cells MC0 to MCn are controlled by voltages supplied to floating gates through word lines WL0 to WLn. Each of memory cells MC0 to MCn can be programmed into one of multiple logic states. More specifically, each of memory cells MC0 to MCn may be configured by a multi level cell (MLC) storing N-bit data, where N is a natural number greater than or equal to 2. To program memory cells MC0 to MCn into one of multiple logic states, multiple verify voltages may be used. Respective memory cells MC0 to MCn may be programmed using different verify voltages according to logic states.

Page buffer 120 comprises multiple page buffers PB0 to PBm. Page buffers PB0 to PBm may be connected to bitlines BL0 to BLm, in a configuration referred to as an all bitline architecture. In the all bitline architecture, during program and read operations of nonvolatile memory device 100, all bitlines BL0 to BLm are simultaneously selected. That is to say, respective page buffers PB0 to PBm may simultaneously program all memory cells arranged on the same row. In addition, during a program operation of memory cells, respective page buffers PB0 to PBm may perform verify read operations of memory cells arranged on corresponding bitlines BL0 to BLm.

Figure 3A:
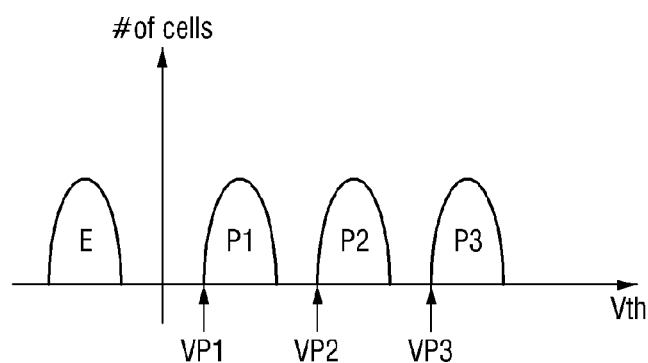
FIG. 3A is a threshold voltage diagram illustrating threshold voltage distributions of memory cells shown in FIG. 2, according to an embodiment of the inventive concept.
Figure 3B:
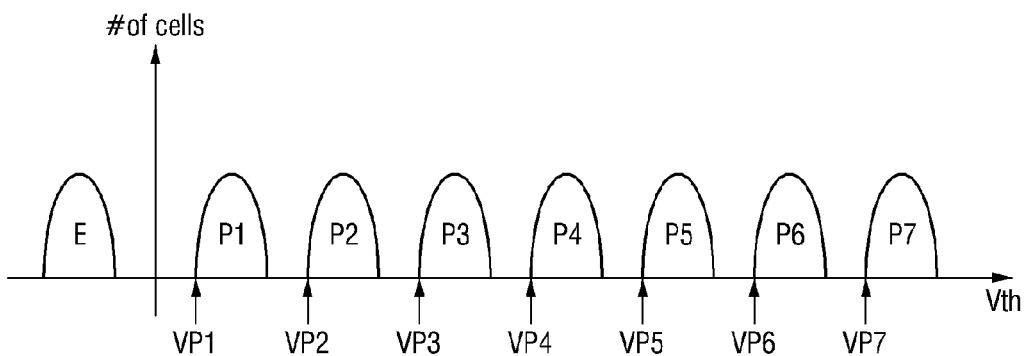
FIG. 3B is a threshold voltage diagram illustrating threshold voltage distributions of memory cells shown in FIG. 2, according to an embodiment of the inventive concept.

FIGS. 3A and 3B are threshold voltage (Vth) diagrams illustrating threshold voltage distributions of memory cells shown in FIG. 2, according to an embodiment of the inventive concept. In FIGS. 3A and 3B, a horizontal axis represents voltage and a vertical axis indicates the number of memory cells.

Referring to FIG. 3A, memory cells MC0 to MCn shown in FIG. 1 may be programmed into one of four logic states (including an erase state). That is to say, each of memory cells MC0 to MCn may be configured by an MLC storing 2-bit data. In FIG. 3A, a logic state "E" indicates erased states of memory cells MC0 to MCn, and logic states "P1," "P2" and "P3" indicate programmed states of memory cells MC0 to MCn. Memory cells MC0 to MCn have four threshold voltage distributions corresponding four logic states. The logic states of memory cells MC0 to MCn may be detected by multiple verify voltages VP1, VP2 and VP3.

Program operations of MLC storing 2-bit data may be sequentially performed. In one example, a program operation of the least significant bit (LSB) is first performed and a program operation of the most significant bit (MSB) is then performed.

Referring to FIG. 3B, memory cells MC0 to MCn shown in FIG. 1 are programmed into one of eight logic states (including an erase state). That is to say, each of memory cells MC0 to MCn is an MLC storing 3-bit data. Such memory cells MC0 to MCn may be referred to as triple level cells (TLCs). In FIG. 3B, a logic state "E" represents erased states of memory cells MC0 to MCn, and logic states "P1," "P2," "P3," "P4," "P5," "P6" and "P7" represent programmed states of memory cells MC0 to MCn. Memory cells MC0 to MCn may have eight threshold voltage (Vth) distributions corresponding eight logic states. The logic states of memory cells MC0 to MCn may be determined by multiple verify voltages VP1, VP2, VP3, VP4, VP5, VP6, and VP7.

Program operations of MLC storing 3-bit data may be sequentially performed. In an example, a program operation of the least significant bit (LSB) may first be performed, program operations of central significant bits (CSBs) may be performed, and a program operation of the most significant bit (MSB) may then be performed.

In FIGS. 3A and 3B, threshold voltage distributions of MLCs storing 2- to 4-bit data are exemplified, but aspects of the inventive concept are not limited thereto. The threshold voltage distributions shown in FIGS. 3A to 3B can be modified in various manners. As described above, memory cells MC0 to MCn shown in FIG. 2 may be configured by MLCs storing multi-bit data, including 2-bit, 4-bit, 8-bit, or 16-bit data.

Figure 4:
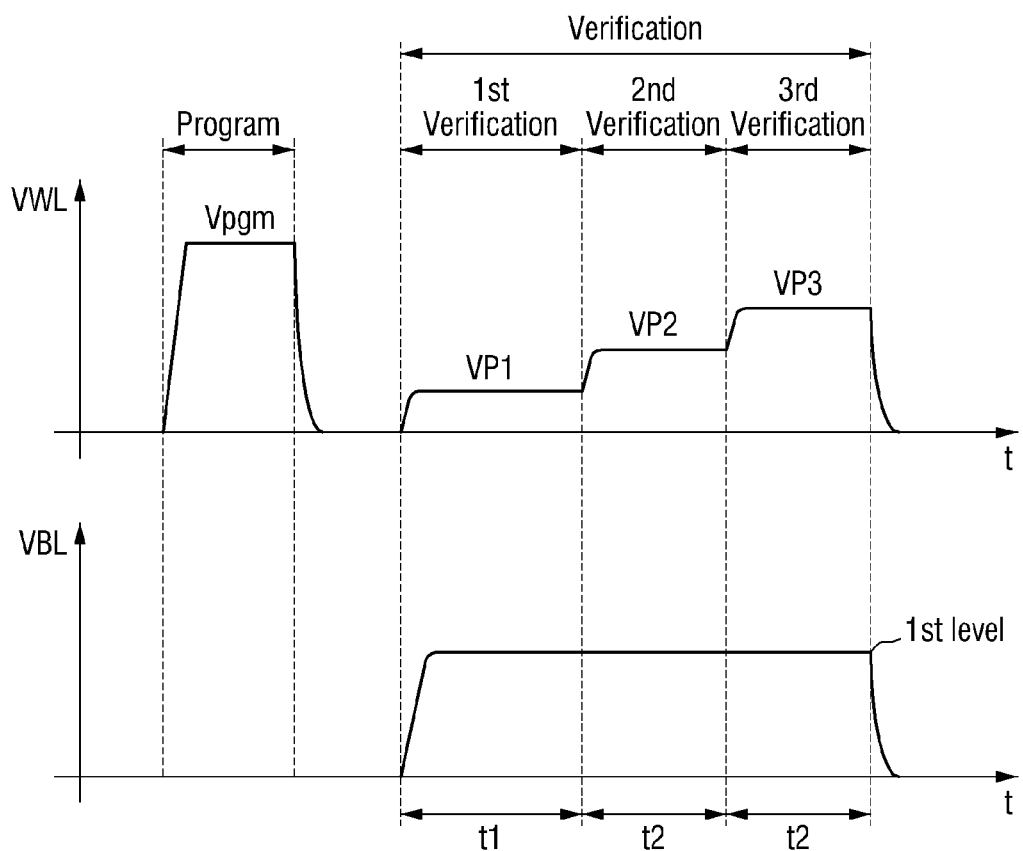
FIG. 4 is a voltage diagram illustrating a program operation of the nonvolatile memory device of FIG. 1, according to an embodiment of the inventive concept.

FIG. 4 is a voltage diagram illustrating a program operation of the nonvolatile memory device of FIG. 1, according to an embodiment of the inventive concept. In FIG. 4, a horizontal axis indicates time (t), and the vertical axis indicates word line voltage (VWL) and bitline voltage (VBL).

Referring to FIG. 4, a program operation of nonvolatile memory device 100 comprises a program period (Program) to increase threshold voltages of memory cells by supplying a program voltage Vpgm and a verification period (Verification) to determine threshold voltages of memory cells by supplying verify voltages Vp1, Vp2 and Vp3. The verification period (Verification) can be divided into multiple periods corresponding to the logic states of the memory cells.

During the program period (Program), program voltage Vpgm is supplied to a selected word line WL and pass voltages is supplied to unselected word lines WL. After the program operation, selected word line WL is discharged.

Next, verify read operations are performed. In the verification period (Verification), the verify read operations may be performed for respective verify voltages VP1, VP2 and VP3 corresponding to the logic states of the memory cells. Respective verify voltages VP1, VP2 and VP3 may be supplied to floating gates of the memory cells. Levels of respective verify voltages VP1, VP2 and VP3 may increase according to the logic states of the memory cells.

For convenience, FIG. 4 illustrates an example where the memory cell is an MLC storing 2-bit data. Therefore, the verification period (Verification) comprises a first verification period (1st verification), a second verification period (2nd verification), and a third verification period (3rd verification). The 1st verification, the 2nd verification and the 3rd verification are performed consecutively.

Bitline BL is placed in a precharged state by precharging it to a first level during the 1st verification, is maintained in the precharged state during the 2nd verification, and then is discharged after the 3rd verification is terminated. Where the memory cell is an MLC storing N-bit data, bitline BL is maintained in the precharged state during second to (N−1)-th verification periods, and is discharged after the N-th verification period. A time t2 required for second to N-th verification periods is shorter than a time t2 required for the 1st verification, which is because an additional precharge operation of bitline BL is skipped during a subsequent verification period.

During the 1st verification, a first verify voltage (Vp1) is supplied to selected word line WL, and verify read operations of memory cells commonly connected to selected word line WL are performed. Pass voltages are supplied to unselected word lines WL. During the 1st verification, verify read operations of memory cells programmed in first state P1 are performed. During second and 3rd verifications, verify read operations are performed in substantially the same manner as those during the 1st verification. Where the verification period is terminated, verify voltages may gradually increase.

During the 1st verification, the voltage of bitline BL is maintained in the precharged state, without being discharged, irrespective of whether the memory cells are on/off, i.e., irrespective of a difference between the threshold voltage and verify voltage of the memory cell.

Figure 5:
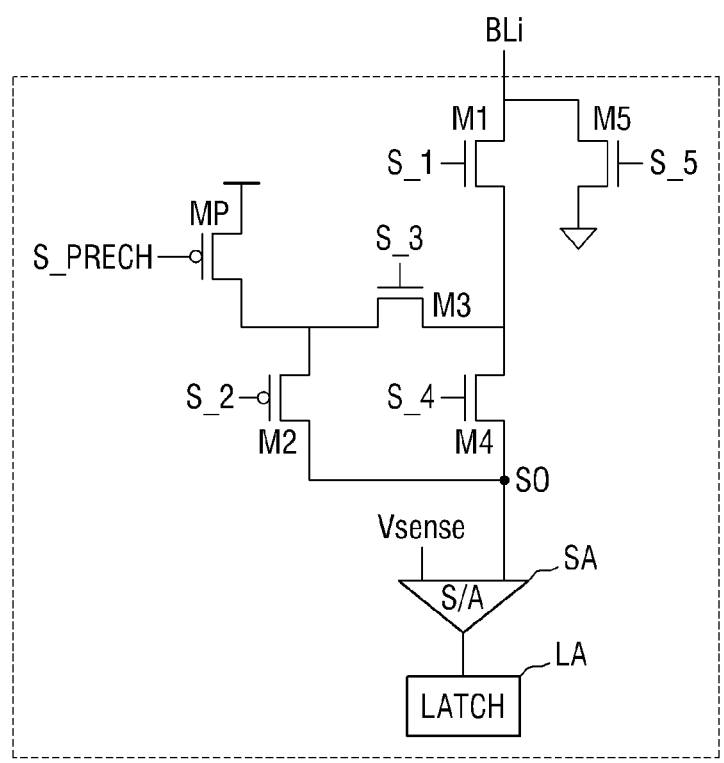
FIG. 5 is a block diagram illustrating a configuration of a page buffer performing verify read operations of FIG. 4, according to an embodiment of the inventive concept.
Figure 6:
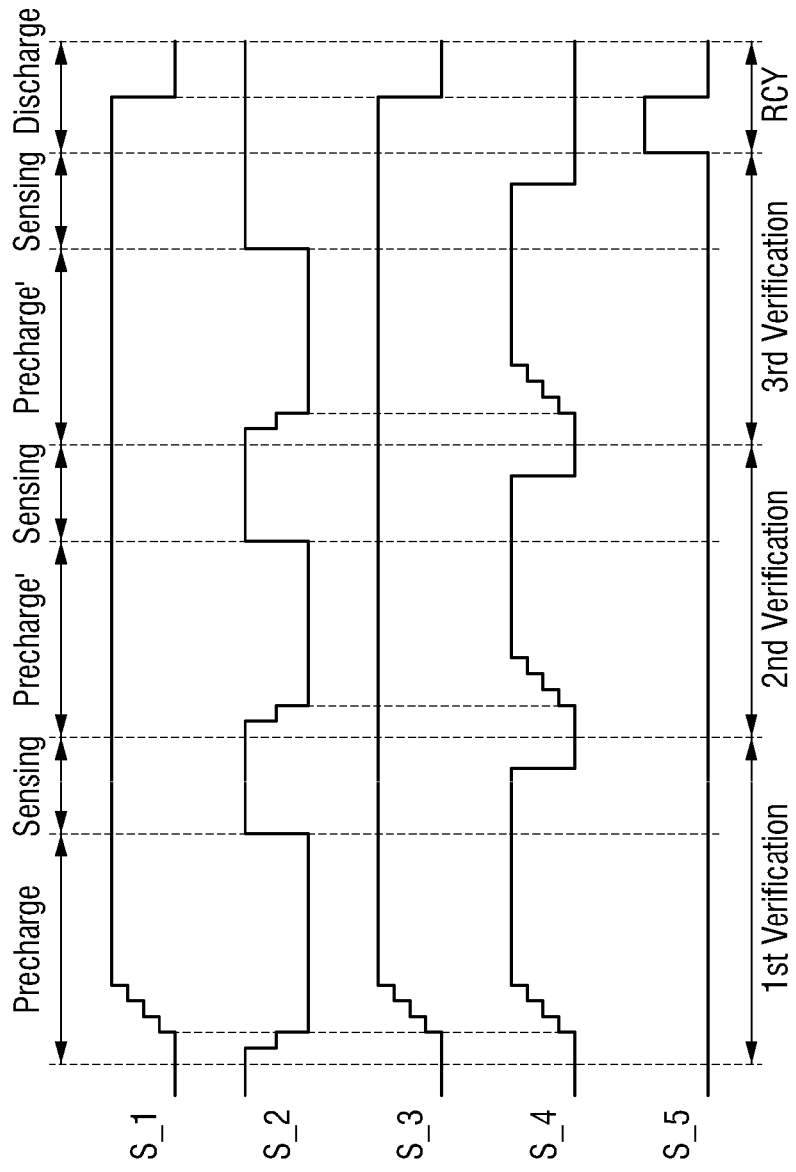
FIG. 6 is a timing diagram illustrating operations of a page buffer performing verify read operations of FIG. 4, according to an embodiment of the inventive concept.

FIG. 5 is a block diagram illustrating a configuration of a page buffer performing verify read operations of FIG. 4, according to an embodiment of the inventive concept. FIG. 6 is a timing diagram illustrating operations of a page buffer performing verify read operations of FIG. 4, according to an embodiment of the inventive concept.

Referring to FIG. 5, page buffer 121 may comprise a precharge transistor MP for performing a precharge operation, multiple transistors M1 to M5 for performing sensing operations, a sense amplifier S/A for sensing a voltage of a sensing node, and a latch circuit LA for controlling transistors M1 to M5. In some embodiments, precharge transistor MP and second transistor M2 may be PMOS transistors, and the first transistor and the third to fifth transistors may be NMOS transistors.

Referring to FIG. 6, during a precharge period of the 1st verification, because a first signal S_1, a third signal S_3 and a fourth signal S_4 are at high levels and a second signal S_2 is at a low level, first to fourth transistors M1 to M4 are turned on. During the verification period (1st to 3rd verifications), a precharge signal S_PRECH is maintained at a low level to control precharge transistor MP to be continuously turned on. Precharge signal S_PRECH is maintained at a low level, irrespective of whether the memory cell arranged on a corresponding bitline BLi is programmed. Accordingly, a precharge voltage in a first level is supplied to sensing node S0 and bitline BLi.

Next, during a sensing period of the 1st verification, because the first to fourth signals S_1 to S_4 are at high levels, only second transistor M2 among the first to fourth transistors M1 to M4 is turned off. Here, where a memory cell is in an off state, because the threshold voltage of the memory cell is higher than first verify voltage Vp1, the voltage level of bitline BLi is maintained. Sense amplifier S/A compares a sensed voltage Vsense with a voltage of the sensing node to sense that the voltage level is not changed, thereby determining the corresponding memory cell to be a pass memory cell.

Where a memory cell is in an on state, even if the threshold voltage of the memory cell is lower than the first verify voltage Vp1, the voltage level of bitline BLi is maintained. Because precharge transistor MP, first transistor M1 and third transistor M3 are continuously turned on, the precharge voltage is continuously supplied to bitline BLi. However, while current flows from sensing node S0 to bitline BLi, the voltage level of sensing node S0 is lowered. Sense amplifier S/A senses whether the voltage level of sensing node S0 is changed, thereby determining the corresponding memory cell to be a fail memory cell. This sensing method may be referred to as a current sensing method.

During the 2nd and 3rd verifications, verify read operations are performed in substantially the same manner as those during the 1st verification. During the 2nd and 3rd verifications, because first signal S_1 and third signal S_3 are maintained at high levels, bitline BLi is maintained in a precharged state without being discharged. Precharge periods (Precharge') of the 2nd and 3rd verifications may be shorter than a precharge period (Precharge) of the 1st verifications because only sensing node S0 needs to be precharged. After the verification period (1st to 3rd Verifications) are terminated, during a recovery period (RCY), a fifth signal S_5 is at a high level, fifth transistor M5 is turned on to discharge bitline BLi.

In a typical nonvolatile memory device, the page buffer controls a precharge operation and a sensing operation using a single or the same latch, and precharge voltage supply to bitline BLi is interrupted during a sensing period, thereby lowering the voltage of bitline BLi. Therefore, a precharge operation of bitline BLi is performed separately for the respective verification periods. This also applies to a case of using a current sensing method.

Page buffer 121 of FIG. 5, however, is divided into a circuit for controlling the precharge operation and a circuit for controlling the sensing operation. During the verification period (1st to 3rd Verifications), precharge signals S_PRECH of all page buffers 121 are maintained at a low level, and precharge transistor MP is continuously turned on, and the sensing operation is controlled by a separate latch circuit (LA). Therefore, once bitline BLi is precharged, an additional precharge operation of bitline BLi is skipped (without discharging bitline BLi) during a subsequent verification period. Accordingly, a time required for verify read operations is reduced, thereby reducing the overall program time.

Figure 7:
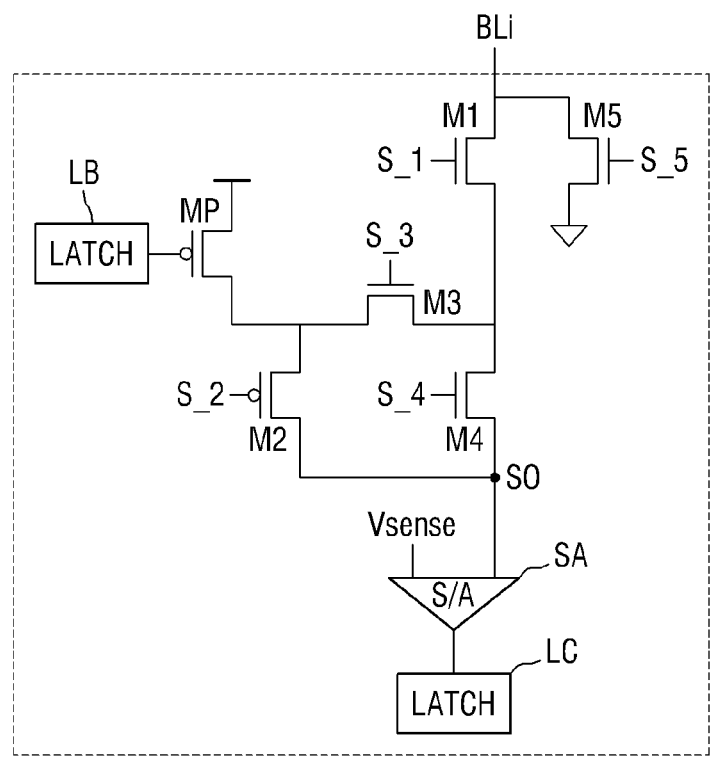
FIG. 7 is a block diagram illustrating a page buffer performing verify read operations of FIG. 4, according to an embodiment of the inventive concept.

FIG. 7 is a block diagram illustrating a page buffer performing verify read operations of FIG. 4, according to an embodiment of the inventive concept. For brevity, the following description will focus on differences between the page buffers shown in FIGS. 5 and 7.

Referring to FIG. 7, page buffer 121' performing verify read operations of FIG. 4 comprises a precharge transistor MP for performing a precharge operation, multiple transistors M1 to M5 for performing sensing operations, a sense amplifier S/A for sensing a voltage of a sensing node, a first latch LB for controlling precharge transistor MP and a second latch LC for controlling transistors M1 to M5.

Transistors M1 to M5 and sense amplifier S/A operate in substantially the same manner as shown in FIG. 6. During a verification period (1st to 3rd Verifications), first latch LB provide a low level signal to precharge transistor MP to control precharge transistor MP to be continuously turned on. First latch LB may provide a high level signal to precharge transistor MP according to whether memory cells arranged on a corresponding bitline BLi is programmed. Accordingly, a precharge voltage of a first level is supplied to a sensing node S0 and bitline BLi.

Similar to page buffer 121 shown in FIG. 5, page buffer 121' shown in FIG. 7 includes separate circuits for controlling a precharge operation and for controlling a sensing operation. In detail, during a verification period (1st to 3rd Verifications), first latch LB of page buffer 121' performing a program operation supplies a low-level signal to allow precharge transistor MP to be continuously turned on, and second latch LC controls a sensing operation. First latch LB and second latch LC are configured by different circuits. Therefore, once a bitline BLi is precharged, an additional precharge operation of bitline BLi may be skipped during a subsequent verification period (without bitline BLi being discharged). Accordingly, a time required for verify read operations is reduced, thereby reducing the overall program time.

Figure 8:
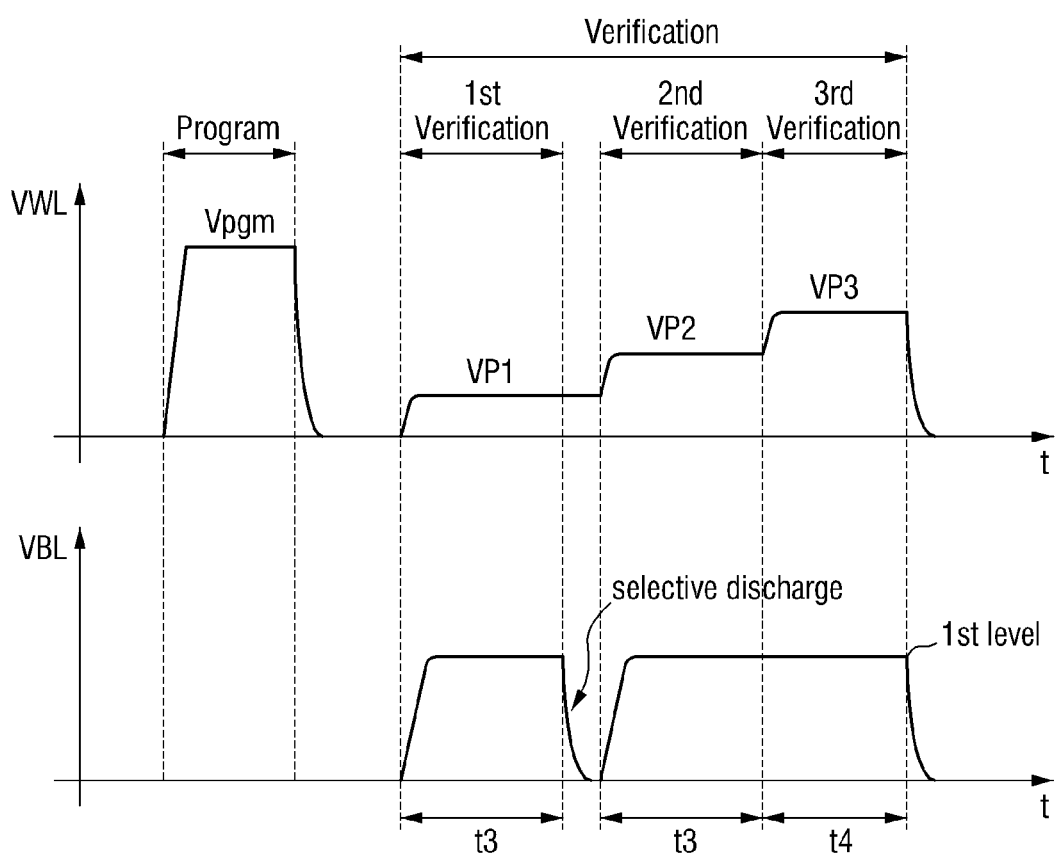
FIG. 8 is a voltage diagram illustrating a program operation of the nonvolatile memory device of FIG. 1, according to an embodiment of the inventive concept.

FIG. 8 illustrates a program operation of the nonvolatile memory device of FIG. 1, according to an embodiment of the inventive concept. In FIG. 8, the horizontal axis indicates time (t), and the vertical axis indicates word line voltage (VWL) and bitline voltage (VBL). For brevity, the following description will focus on differences between the program operations shown in FIGS. 4 and 8.

Referring to FIG. 8, the program operation comprises a program period (Program) to increase threshold voltages of memory cells by supplying a program voltage Vpgm and a verification period (Verification) to determine threshold voltages of memory cells by supplying verify voltages Vp1, Vp2 and Vp3.

After the 1st and 2nd verifications are terminated, a bitline BL may be selectively discharged. FIG. 8 illustrates a case in which bitline BL is selectively discharged after the 1st verification is terminated. Next, during the 2nd verification subsequent to the 1st verification, bitline BL is re-precharged to a first level and then discharged after the 3rd verification is terminated. Where memory cells are an MLC storing N-bit data, bitline BL may be selectively discharged after a verification period among the first to (N−1)-th verification periods are terminated. Next, during a verification period subsequent to the verification period, bitline BL is re-precharged to the first level and then discharged after the N-th verification period is terminated. Where necessary, the selective discharge may be performed multiple times. A time t4 required for the verification period in which bitline BL is maintained in a precharged state is shorter than a time t3 required for the verification period in which bitline BL is precharged (or re-precharged).

Figure 9:
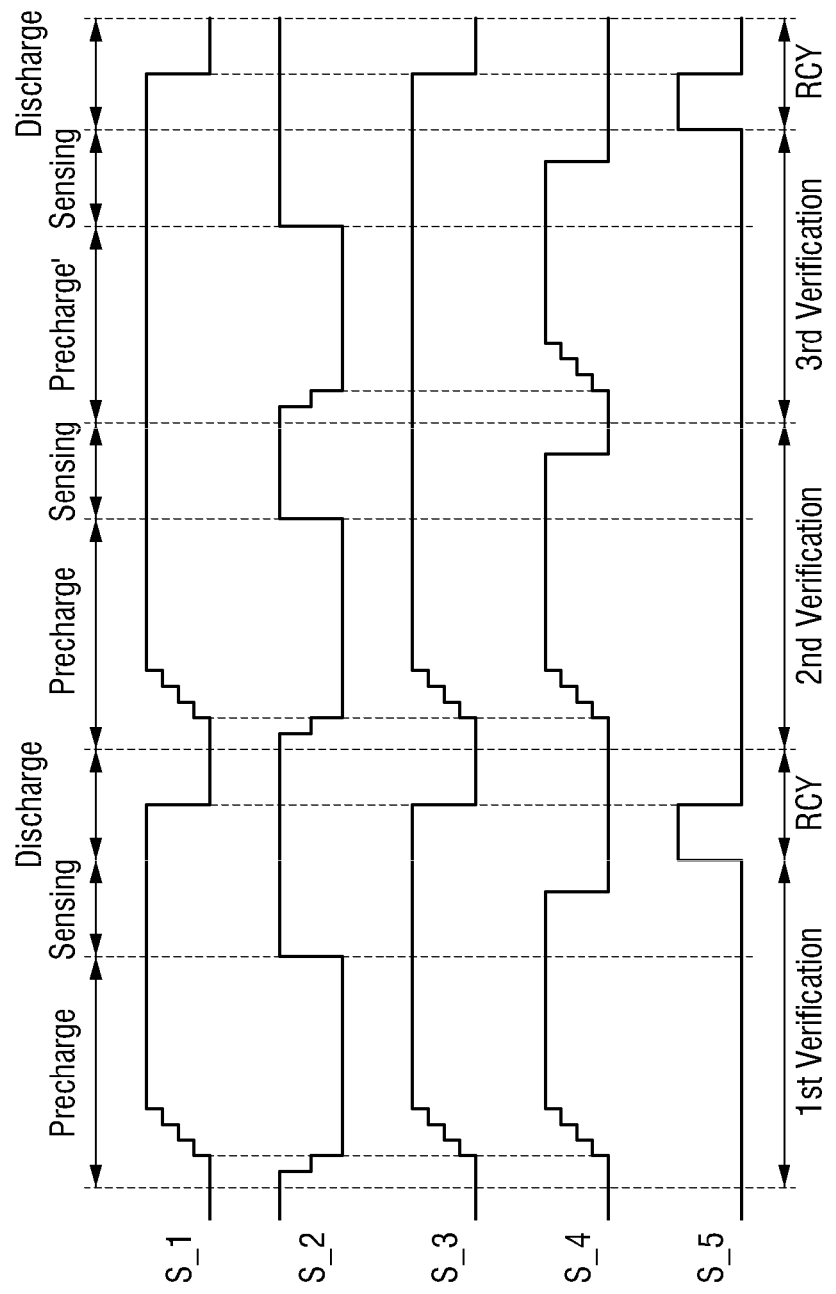
FIG. 9 is a timing diagram illustrating operations of a page buffer performing verify read operations of FIG. 8, according to an embodiment of the inventive concept.

FIG. 9 is a timing diagram illustrating operations of the page buffer performing verify read operations of FIG. 8, according to an embodiment of the inventive concept. The diagram of FIG. 9 will be described with reference to page buffer 121 of FIG. 5.

Referring to FIG. 9, a recovery period (RCY) is inserted between the 1st verification and the 2nd verification. During a precharge period of the 1st verification, a precharge voltage of a first level is supplied to sensing node S0 and bitline BLi.

Next, during a sensing period of the 1st verification, sense amplifier S/A senses whether the voltage level of sensing node S0 is changed, thereby determining the corresponding memory cell to be a pass or fail memory cell. After the 1st verification is terminated, because a fifth signal S_5 is at a high level in the recovery period (RCY), fifth transistor M5 is turned on to discharge bitline BLi.

Next, during a precharge period of the 2nd verification, first signal S_1, third signal S_3 and fourth signal S_4 are at high levels and second signal S_2 is at a low level, the first to fourth transistors M1 to M4 are turned on. During the verification period (1st to 3rd verifications), precharge signal S_PRECH is maintained at a low level to control precharge transistor MP to be continuously turned on. Accordingly, the precharge voltage of the first level is supplied to sensing node S0 and bitline BLi and sensing node S0 and bitline BLi are re-precharged.

During the 3rd verification, because first signal S_1 and third signal S_3 are maintained at high levels, bitline BLi is maintained in the precharged state without being discharged.

Figure 10:
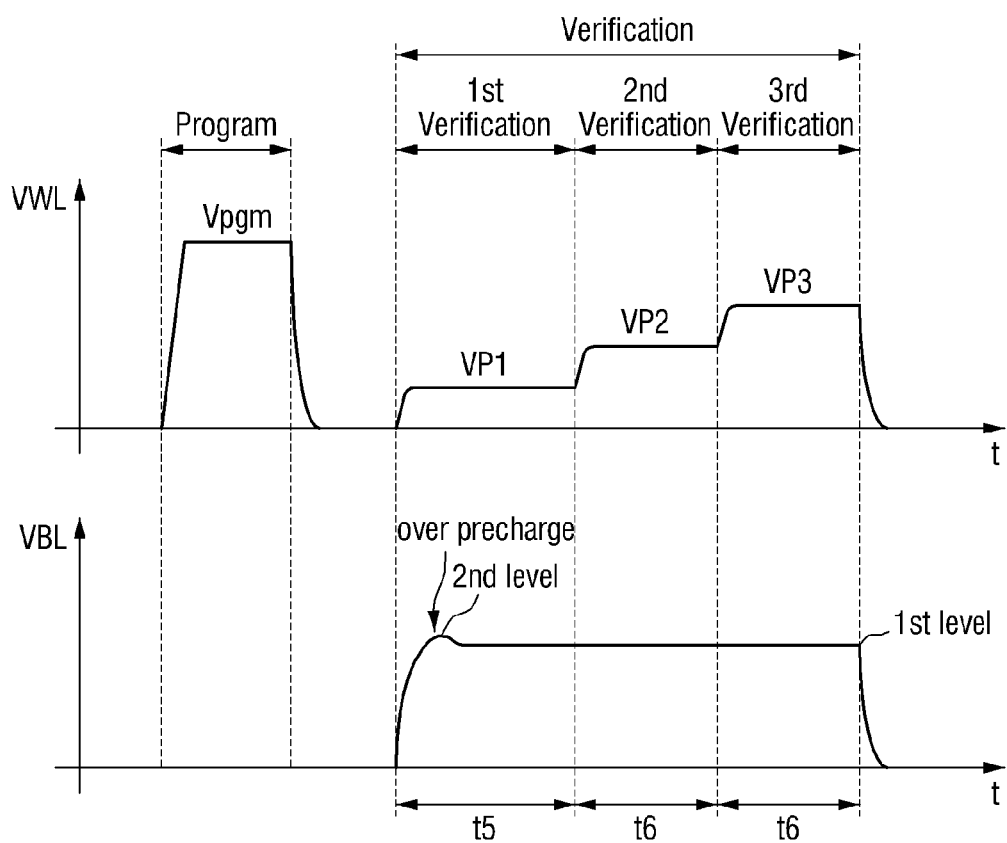
FIG. 10 is a voltage diagram illustrating a program operation of the nonvolatile memory device of FIG. 1, according to an embodiment of the inventive concept.

FIG. 10 is a voltage diagram illustrating a program operation of the nonvolatile memory device of FIG. 1, according to an embodiment of the inventive concept. In FIG. 10, the horizontal axis indicates time (t), and the vertical axis indicates word line voltage (VWL) and bitline voltage (VBL). For brevity, the following description will focus on differences between the program operations shown in FIGS. 4 and 10.

Referring to FIG. 10, the program operation comprises a program period (Program) to increase threshold voltages of memory cells by supplying a program voltage Vpgm and a verification period (Verification) to determine threshold voltages of memory cells by supplying verify voltages Vp1, Vp2 and Vp3.

After being precharged to a second level, bitline BL is precharged to a first level during a 1st verification. The second level may be greater than the first level. Such a precharge operation may be referred to as an over precharge. The over precharge is used to reduce an offset in the voltage levels between bitlines BL0 to BLm during the precharge operation. During a 2nd verification, bitline BL is maintained in a state in which it is precharged to the first level, and then discharged after a 3rd verification is terminated. Where memory cells are an MLC storing N-bit data, during 2nd to (N−1)-th verifications, bitline BL is maintained in a state in which it is precharged to the first level and then discharged after the N-th verification is terminated. A time t6 required for the 2nd to N-th verifications is shorter than a time t5 required for the 1st verification, which is because an additional precharge operation of bitline BL is skipped during a subsequent verification period.

Figure 11:
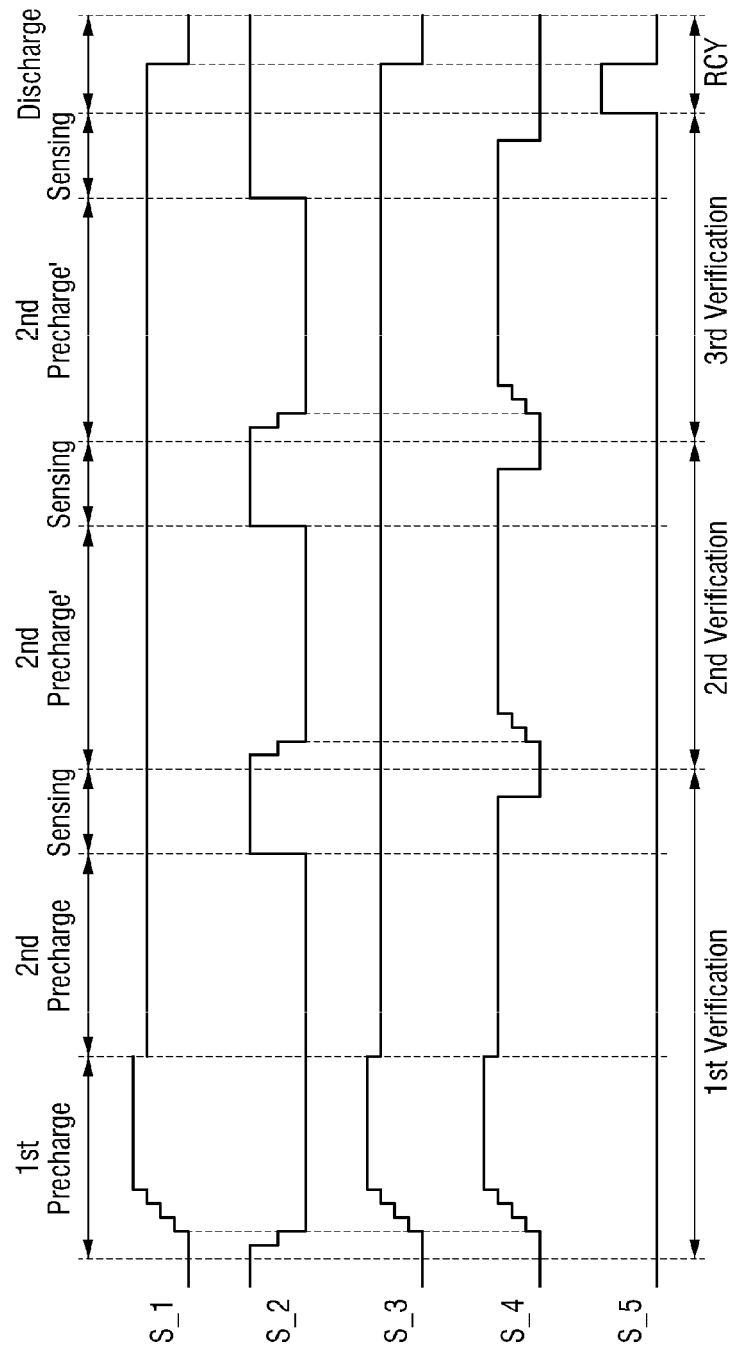
FIG. 11 is a timing diagram illustrating operations of a page buffer performing verify read operations of FIG. 10, according to an embodiment of the inventive concept.

FIG. 11 is a timing diagram illustrating operations of the page buffer performing verify read operations of FIG. 10, according to an embodiment of the inventive concept.

Referring to FIG. 11, the 1st verification includes a first precharge period (1st precharge) and a second precharge period (2nd precharge), and the 2nd and 3rd verifications include only a single precharge period, that is, 2nd precharge'. During the 1st verification, sensing node S0 and bitline BLi are precharged in multiple steps. First, during the 1st precharge of the 1st verification, sensing node S0 and bitline BLi are precharged to a second level. Next, during the 2nd precharge of the 1st verification, the voltages of a first signal S_1, a third signal S_3 and a fourth signal S_4 are lowered to a predetermined level. Accordingly, precharged sensing node S0 and precharged bitline BLi are lowered to the first level. That is to say, sensing node S0 and bitline BLi are precharged to the first level.

During the 2nd and 3rd verifications, because first signal S_1 and third signal S_3 are maintained at the predetermined level, bitline BLi is maintained in the state in which it is precharged to the first level without being discharged. During the 2nd precharge' of the 2nd and 3rd verifications, fourth signal S_4 is maintained at the predetermined level, and the precharge voltage of the first level is supplied to sensing node S0. Because only sensing node S0 needs to be precharged, the 2nd Precharge' of the 2nd and 3rd verifications may be shorter than the 1st and 2nd precharges of the 1st verification.

Although not specifically illustrated, in some embodiments bitline BLi may be selectively discharged after the 1st or 2nd verifications are terminated. Where necessary, the selective discharge may be performed multiple times.

Figure 12:
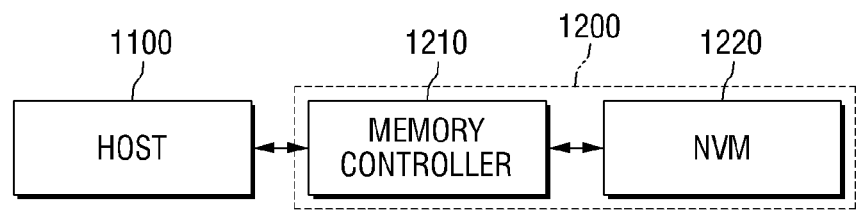
FIG. 12 is a block diagram illustrating a system comprising a nonvolatile memory device, according to an embodiment of the inventive concept.

FIG. 12 is a block diagram illustrating a system comprising a nonvolatile memory device according to an embodiment of the inventive concept.

Referring to FIG. 12, system 1000 comprises a host 1100 and a data storage device 1200. Host 1100 is configured to control data storage device 1200, and may take various alternative forms, such as a portable electronic device, such as a personal/portable computer, a personal digital assistant (PDA), a portable media player (PMP), or an MP3 player, for example. Host 1100 and data storage device 1200 may be connected by a standardized interface such as USB, SCSI, ESDI, SATA, SAS, PCIexpress, or IDE interface. However, the interfacing method for connecting host 1100 and data storage device 1200 is limited to those listed herein.

Data storage device 1200 comprises a memory controller 1210 and a nonvolatile memory device (NVM) 1220. Memory controller 1210 may control program/read/erase operations of NVM 1220 in response to a request from host 1100.

NVM 1220 may include multiple nonvolatile memory chips. The nonvolatile memory chips may be configured or may operate in substantially the same manner as nonvolatile memory devices described above.

Data storage device 1200 may be configured by a solid state disk (SSD) device, for example. Alternatively, data storage device 1200 may be configured by a personal computer memory card international association (PCMCIA), a compact flash card (CF), a smart media card (SM, SMC), a memory stick, a multi media card (MMC, RS-MMC, MMC-micro), a secure digital card (SD, miniSD, microSD), a Universal Flash storage (UFS), and the like, but not limited thereto.

Figure 13:
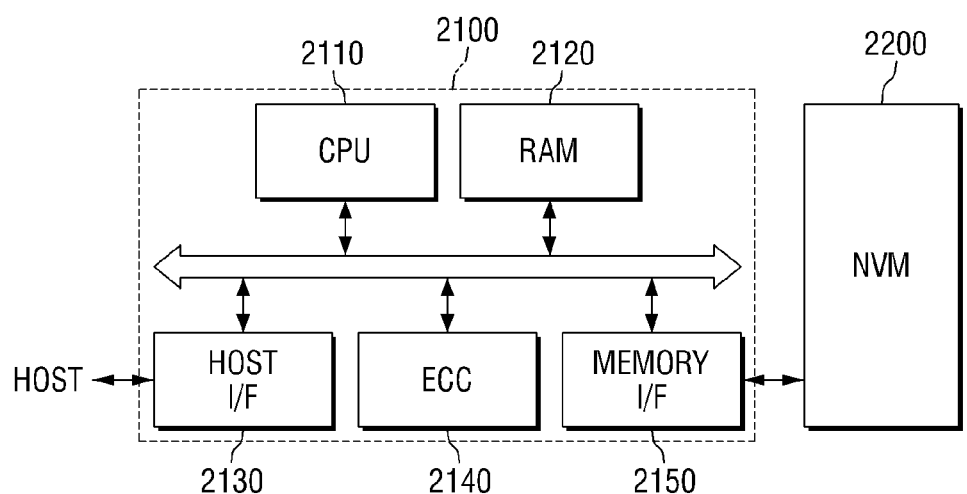
FIG. 13 is a block diagram illustrating a memory system comprising a nonvolatile memory device, according to an embodiment of the inventive concept.

FIG. 13 is a block diagram illustrating a memory system incorporating the nonvolatile memory device according to an embodiment of the inventive concept.

Referring to FIG. 13, memory system 2000 comprises a memory controller 2100 and a nonvolatile memory device (NVM) 2200.

Memory controller 2100 controls program/read/erase operations of NVM 2200 in response to a request from a host. memory controller 2100 may include a CPU 2110, an RAM 21200, a host interface (I/F) 2130, an error correction code block (ECC) 2140, and a memory interface (I/F) 2150.

CPU 2110 controls overall operations of memory controller 2100. RAM 2120 may be used as a working memory of CPU 2110. Host I/F 2130 interfaces with the host connected to memory system 2000 to exchange data. ECC 2140 detects and corrects errors of data read from NVM 2200. Memory I/F 2150 interfaces with NVM 2200 to exchange data.

NVM 2200 comprises multiple nonvolatile memory chips, which may be configured or may operate in substantially the same manner as nonvolatile memory devices described above.

Figure 14:
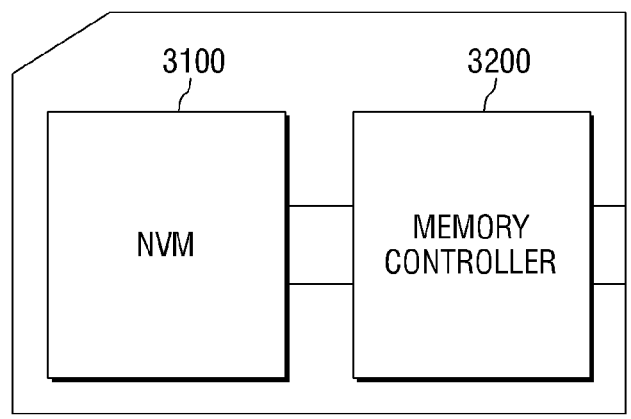
FIG. 14 is a block diagram illustrating a data storage device comprising a nonvolatile memory device, according to an embodiment of the inventive concept.

FIG. 14 is a block diagram illustrating a data storage device incorporating a nonvolatile memory device according to an embodiment of the inventive concept.

Referring to FIG. 14, data storage device 3000 comprises a nonvolatile memory device (NVM) 3100 and a memory controller 3200. NVM 3100 comprises multiple nonvolatile memory chips, which may be configured or may operate in substantially the same manner as nonvolatile memory devices described above.

Memory controller 3200 controls program/read/erase operations of NVM 3100 in response to an externally applied request. Data storage device 3000 may be, for instance, a memory card device, an SSD device, a multimedia card device, an SD device, a memory stick device, a hard disk drive device, a hybrid drive device, or a general-purpose serial bus flash device. For example, data storage device 3000 may be a card for using a system, such as a digital camera, or a personal computer.

Figure 15:
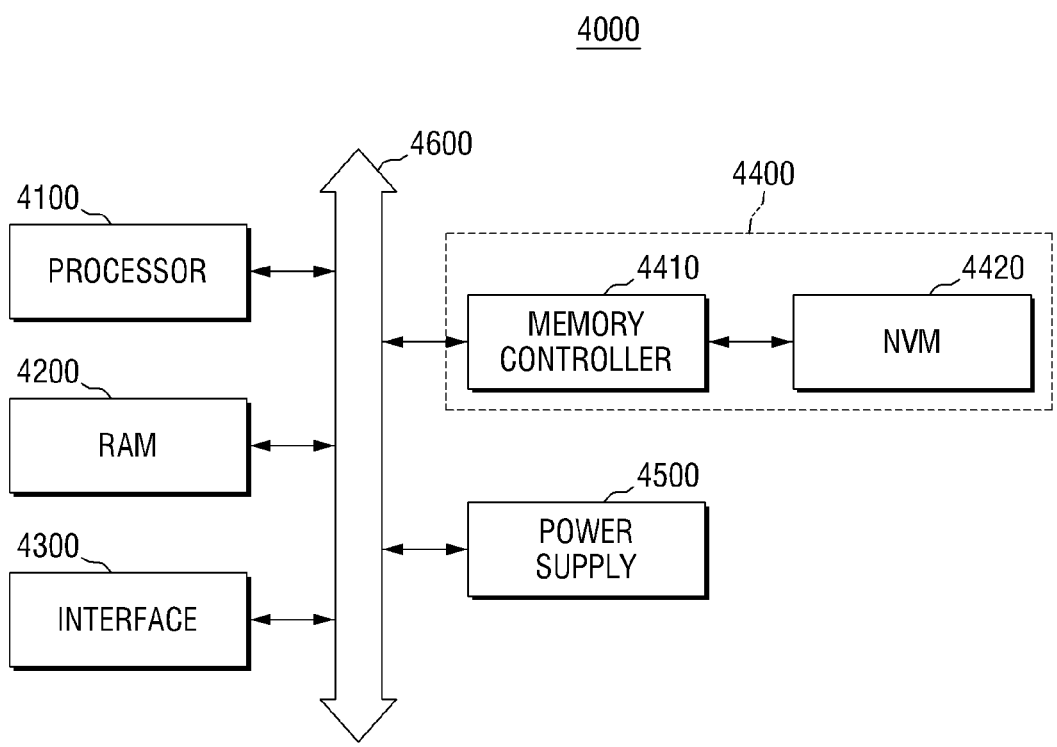
FIG. 15 is a block diagram illustrating a system comprising a nonvolatile memory device, according to an embodiment of the inventive concept.

FIG. 15 is a block diagram illustrating a computing system incorporating a nonvolatile memory device according to an embodiment of the inventive concept.

Referring to FIG. 15, computing system 4000 comprises a processor 4100, a random access memory (RAM) 4200, an interface 4300, a memory system 4400, a power supply 4500, and a bus 4600. processor 4100, RAM 4200, interface 4300, memory system 4400 and power supply 4500 may be electrically connected to each other through bus 4600. Bus 4600 may correspond to a path through which data moves.

Processor 4100 comprises at least one of a microprocessor, a digital signal processor, a microcontroller, and logic elements capable of functions similar to those of these elements. RAM 4200 may be used as a working memory for improving the operation of processor 4100. Interface 4300 may perform functions of transmitting data to a communication network or receiving data from the communication network. interface 4300 may be wired or wireless. For example, interface 4300 may comprise an antenna or a wired/wireless transceiver, and so on. Memory system 4400 may store data and/or commands. memory system 4400 may include a memory controller 4410 and a nonvolatile memory device (NVM) 4420. Memory controller 4410 may control program/read/erase operations of NVM 4420. NVM 4420 may comprise multiple nonvolatile memory chips. The nonvolatile memory chips may be configured or may operate in substantially the same manner as nonvolatile memory devices described above. Power supply 4500 supplies operating power to processor 4100, RAM 4200, interface 430 and memory system 4400.

Computing system 4000 may take any of various forms, such as a personal digital assistant (PDA), a portable computer, a web tablet, a wireless phone, a mobile phone, a digital music player, a memory card, or any type of electronic device capable of transmitting and/or receiving information in a wireless environment.

The foregoing is illustrative of embodiments and is not to be construed as limiting thereof. Although a few embodiments have been described, those skilled in the art will readily appreciate that many modifications are possible in the embodiments without materially departing from the scope of the inventive concept. Accordingly, all such modifications are intended to be included within the scope of the inventive concept as defined by the claims.

What is claimed is:

1. A nonvolatile memory device, comprising:
    a memory cell array comprising multiple memory cells disposed at intersections of corresponding word lines and bitlines; and
    page buffers respectively connected to the bitlines, and performing consecutive verify read operations on selected memory cells programmed in first to N-th logic states (N>2),
    wherein, in the consecutive verify read operations, at least one of the bitlines is placed in a precharged state by being precharged to a first level during a verification period for memory cells programmed in the first logic state, maintained in the precharged state during at least two verification periods for memory cells programmed in the second to (N−1)-th logic states, and then discharged after a verification period for memory cells programmed in the N-th logic state.

2. The nonvolatile memory device of claim 1, wherein at least another one of the bitlines is selectively discharged after a verification period for memory cells programmed in at least one of the first to (N−1)-th logic states, and then re-precharged to the first level during a subsequent verification period.

3. The nonvolatile memory device of claim 1, wherein each of the page buffers comprises a precharge circuit performing a precharge operation to supply a precharge voltage to the at least one of the bitlines, and a latch circuit controlling a sensing operation to sense voltages of sensing nodes connected to the bitlines, the precharge circuit being controlled to supply the precharge voltage to the at least one of the bitlines irrespective of whether memory cells connected to the at least one of the bitlines are programmed.

4. The nonvolatile memory device of claim 1, wherein each of the page buffers comprises a first latch circuit controlling a precharge operation to supply a precharge voltage to the at least one of the bitlines, and a second latch circuit, different from the first latch circuit, and controlling a sensing operation to sense voltages of sensing nodes connected to the bitlines.

5. The nonvolatile memory device of claim 1, wherein the bitlines are precharged to a second level, greater than the first level, during the verification period of memory cells programmed in the first logic state and then precharged to the first level.

6. The nonvolatile memory device of claim 1, wherein the bitlines remain precharged to the first level during verification periods for memory cells programmed in the second to (N−1)-th states, and are discharged after the verification period for memory cells programmed in the N-th state.

7. The nonvolatile memory device of claim 6, wherein at least another one of the bitlines is selectively discharged after a verification period of memory cells programmed in at least one of the first to (N−1)-th states, and then re-precharged to the first level during a subsequent verification period.

8. The nonvolatile memory device of claim 1, wherein verification periods for memory cells programmed in the second to (N−1)-th states are shorter in duration than the verification period for memory cells programmed in the first logic state.

9. The nonvolatile memory device of claim 1, wherein the page buffers perform verify read operations on the memory cells using current sensing.

10. A method of programming a nonvolatile memory device, comprising:
   supplying a program voltage to a word line during a program period to program memory cells to one of multiple logic states; and
   consecutively supplying verify voltages respectively corresponding to first to N-th states (N>2) to the word line during a verification period while supplying a precharge voltage to bitlines connected to the memory cells in order to consecutively perform verify read operations on memory cells programmed in first to N-th states,
   wherein at least one of the bitlines is placed in a precharged state by being precharged to a first level during a verification period for memory cells programmed to the first logic state, maintained in the precharged state during at least two verification periods for memory cells programmed in the second to (N−1)-th states, and then discharged after a verification period for memory cells programmed to the N-th state.

11. The method of claim 10, wherein at least another one of the bitlines is selectively discharged after a verification period for memory cells programmed in at least one of the first to (N−1)-th states, and then re-precharged to the first level during a subsequent verification period.

12. The method of claim 10, wherein the bitlines are precharged to a second level, higher than the first level, during the verification period for memory cells programmed in the first logic state, and are then precharged to the first level.

13. The method of claim 12, wherein the bitlines are maintained precharged to the first level during verification periods for memory cells programmed in the second to (N−1)-th states, and are then discharged after the verification period of memory cells programmed in the N-th state.

14. The method of claim 13, wherein at least one of the bitlines is selectively discharged after a verification period for memory cells programmed in at least one of the first to (N−1)-th states, and then re-precharged to the first level during a subsequent verification period.

15. The method of claim 10, wherein verification periods for memory cells programmed in the second to (N−1)-th states are shorter in duration than the verification period for memory cells programmed in the first logic state.

16. A system, comprising:
   a host device; and
   a nonvolatile memory device operating under control of the host device, the nonvolatile memory device comprising a memory cell array comprising multiple memory cells disposed at intersections of corresponding word lines and bitlines, and page buffers respectively connected to the bitlines, and performing consecutive verify read operations on selected memory cells programmed in first to N-th logic states (N>2),
   wherein, in the consecutive verify read operations, at least one of the bitlines is placed in a precharged state by precharging to a first level during a verification period for memory cells programmed in the first logic state, maintained in the precharged state during at least two verification periods for memory cells programmed in the second to (N−1)-th logic states, and then discharged after a verification period of memory cells programmed in the N-th logic state.

17. The system of claim 16, wherein the at least one of the bitlines is selectively discharged after a verification period of memory cells programmed in at least one of the first to (N−1)-th logic states, and then re-precharged to the first level during a subsequent verification period.

18. The system of claim 16, wherein each of the page buffers comprises a precharge circuit performing a precharge operation to supply a precharge voltage to the bitlines, and a latch circuit controlling a sensing operation to sense voltages of sensing nodes connected to the bitlines,
   the precharge circuit being controlled to supply the precharge voltage to the at least one of the bitlines irrespective of whether memory cells connected to the at least one of the bitlines are programmed.

19. The system of claim 16, wherein each of the page buffers comprises a first latch circuit controlling a precharge operation to supply a precharge voltage to the bitlines, and a second latch circuit, different from the first latch circuit, controlling a sensing operation to sense voltages of sensing nodes connected to the bitlines.

20. The system of claim 16, wherein the bitlines are precharged to a second level, higher than the first level, during the verification period for memory cells programmed in the first logic state and then precharged to the first level.

* * * * *